(12) United States Patent
Cheng et al.

(10) Patent No.: US 9,735,155 B2
(45) Date of Patent: Aug. 15, 2017

(54) BULK SILICON GERMANIUM FINFET

(71) Applicant: International Business Machines Corporation, Armonk, NY (US)

(72) Inventors: Kangguo Cheng, Schenectady, NY (US); Juntao Li, Cohoes, NY (US); Shogo Mochizuki, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/967,570

(22) Filed: Dec. 14, 2015

(65) Prior Publication Data

US 2017/0170173 A1   Jun. 15, 2017

(51) Int. Cl.
| | | |
|---|---|---|
| *H01L 29/06* | (2006.01) |
| *H01L 27/08* | (2006.01) |
| *H01L 21/82* | (2006.01) |
| *H01L 27/088* | (2006.01) |
| *H01L 21/8234* | (2006.01) |
| *H01L 29/161* | (2006.01) |

(Continued)

(52) U.S. Cl.
CPC .... *H01L 27/0886* (2013.01); *H01L 21/02532* (2013.01); *H01L 21/823412* (2013.01); *H01L 21/823431* (2013.01); *H01L 29/0649* (2013.01); *H01L 29/1083* (2013.01); *H01L 29/161* (2013.01)

(58) Field of Classification Search
CPC ....... H01L 27/11; H01L 27/088; H01L 21/82; H01L 21/823462; H01L 21/823857; H01L 21/08; H01L 21/088; H01L 29/06; H01L 29/064; H01L 29/0649; H01L 29/10; H01L 29/108; H01L 29/1083; H01L 29/16; H01L 29/161
USPC ........................................................ 257/392
See application file for complete search history.

(56) References Cited

U.S. PATENT DOCUMENTS

| | | |
|---|---|---|
| 8,048,723 B2 | 11/2011 | Chang et al. |
| 8,847,281 B2 | 9/2014 | Cea et al. |
| 8,895,395 B1 | 11/2014 | Kerber et al. |

(Continued)

FOREIGN PATENT DOCUMENTS

| | | |
|---|---|---|
| CN | 104112666 A | 10/2014 |
| CN | 104112667 A | 10/2014 |
| CN | 104752214 A | 7/2015 |

*Primary Examiner* — Monica D Harrison
(74) *Attorney, Agent, or Firm* — Law Offices of Ira D. Blecker, P.C.

(57) ABSTRACT

A bulk SiGe FinFET which includes: a plurality of SiGe fins and a bulk semiconductor substrate, the SiGe fins extending from the bulk semiconductor substrate; the SiGe fins having a top portion and a bottom portion, a part of the bottom portion being doped to form a punchthrough stop; the bulk semiconductor substrate having a top portion in contact with the SiGe fins and comprising a gradient of germanium and silicon, and a bottom portion of silicon in contact with the top portion such that the gradient has a composition of SiGe at the top portion in contact with the SiGe fins that is the same composition of SiGe as in the SiGe fins, the proportion of germanium atoms in the gradient gradually decreasing and the proportion of silicon atoms in the gradient gradually increasing in the gradient until the top portion contacts the bottom portion.

20 Claims, 6 Drawing Sheets

(51) Int. Cl.
   *H01L 29/10*   (2006.01)
   *H01L 21/02*   (2006.01)

(56) References Cited

U.S. PATENT DOCUMENTS

| | | |
|---|---|---|
| 8,957,477 B2 | 2/2015 | Chang et al. |
| 8,994,072 B2 | 3/2015 | Kerber et al. |
| 9,023,715 B2 | 5/2015 | Faul et al. |
| 2015/0044829 A1 | 2/2015 | Kim et al. |
| 2015/0145069 A1 | 5/2015 | Xu et al. |
| 2016/0190319 A1* | 6/2016 | Kavalieros .............. H01L 29/78 257/190 |

* cited by examiner

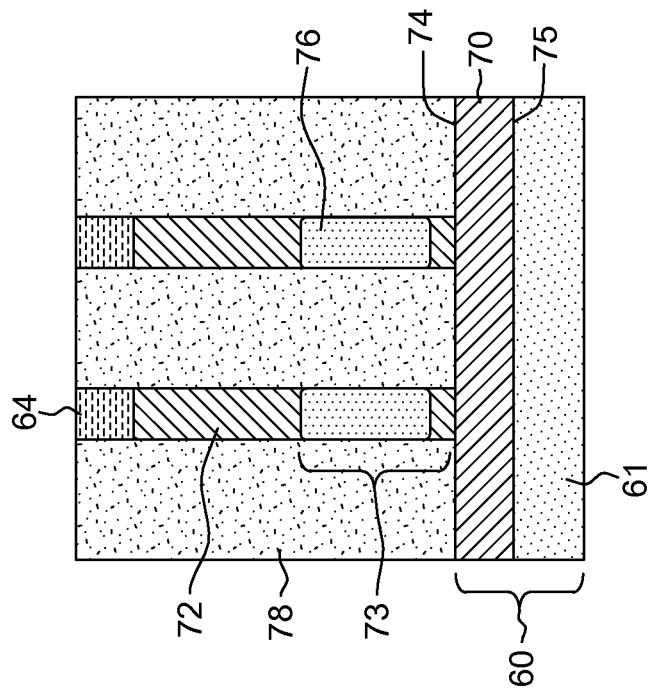
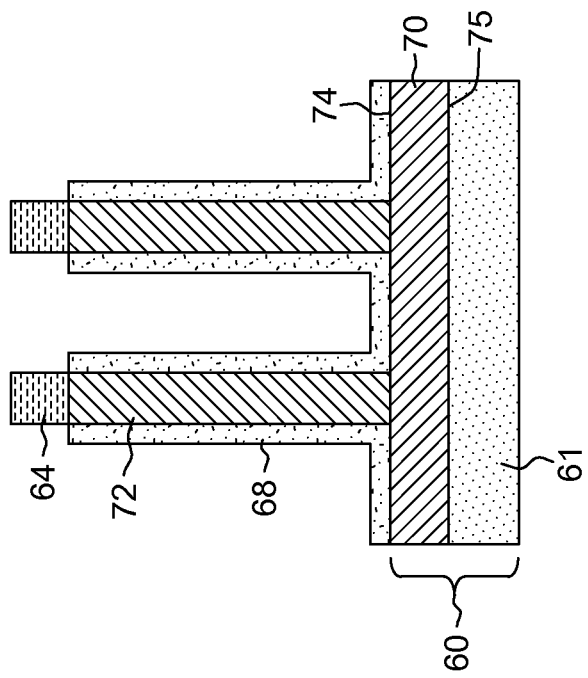

BULK SILICON GERMANIUM FINFET

BACKGROUND

The present exemplary embodiments pertain to bulk Fin-FET devices and, more particularly, pertain to bulk silicon germanium (SiGe) FinFET devices that may avoid certain dislocation just below the SiGe fins.

SiGe fins in a bulk FinFET have been touted as a viable option to improve PFET performance.

FIG. 1 is a plan view of a prior art bulk SiGe FinFET. FIG. 2A is a cross-sectional view of FIG. 1 in the direction of arrows A-A and FIG. 2B is a cross-sectional view of FIG. 1 in the direction of arrows B-B.

FIGS. 2A and 2B illustrate a bulk silicon substrate 10 have fins 12 extending from the bulk silicon substrate 10. The fins 12 include a silicon bottom part 14 and a SiGe top part 16. Silicon bottom part 14 of fins 12 may include a punchthrough stop 18. Insulation between the fins 12 is provided by shallow trench isolation 20. Wrapping around the SiGe top part 16 is a gate dielectric 22 and gate 24. As best seen in FIG. 2B, there is a source 26, drain 28 and gate spacers 30.

BRIEF SUMMARY

The various advantages and purposes of the exemplary embodiments as described above and hereafter are achieved by providing, according to a first aspect of the exemplary embodiments, a bulk SiGe FinFET comprising: a plurality of SiGe fins and a bulk semiconductor substrate, the SiGe fins extending from the bulk semiconductor substrate; the SiGe fins having a top portion and a bottom portion, a part of the bottom portion being doped to form a punchthrough stop; the bulk semiconductor substrate having a top portion in contact with the SiGe fins and comprising a gradient of germanium and silicon, and a bottom portion of silicon in contact with the top portion such that the gradient has a composition of SiGe at the top portion in contact with the SiGe fins that is the same composition of SiGe as in the SiGe fins, the proportion of germanium atoms in the gradient gradually decreasing and the proportion of silicon atoms in the gradient gradually increasing in the gradient until the bulk semiconductor substrate top portion contacts the bulk semiconductor substrate bottom portion.

According to a second aspect of the exemplary embodiments, there is provided a method of forming a bulk SiGe FinFET comprising: forming silicon fins from a bulk silicon substrate; epitaxially growing a SiGe layer on the silicon fins and on the bulk silicon substrate; heating the silicon fins and the bulk silicon substrate in an oxygen ambient to cause the Ge of the SiGe layer to react with the silicon in the silicon fins and a top portion of the bulk silicon substrate to form SiGe; forming a punchthrough stop in a bottom portion of the SiGe fins; forming shallow trench isolation in contact with the bottom portion of the SiGe fins; forming a gate dielectric wrapping around a top portion of the SiGe fins; forming a gate wrapping around the gate dielectric; and forming a source and a drain.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 4 to 10A and 10B illustrate the method for forming a bulk SiGe FinFET and a bulk SiGe FinFET structure described in FIG. 3 wherein:

FIG. 4 illustrates the formation of silicon fins on a bulk silicon substrate.

FIG. 5 illustrates the formation of an epitaxial SiGe layer on the silicon fins and bulk silicon substrate.

FIG. 6 illustrates the conversion of silicon in the silicon fins and a portion of the bulk silicon substrate to SiGe.

FIG. 7 illustrates the formation of a punchthrough stop in a bottom portion of the SiGe fins and the formation of a shallow trench isolation between the SiGe fins.

FIG. 8 illustrates the recessing of the shallow trench isolation.

FIG. 9 is a plan view of the bulk SiGe FinFET according to the exemplary embodiments.

FIG. 10A is a cross-sectional view of FIG. 9 in the direction of arrows A-A and FIG. 10B is a cross-sectional view of FIG. 9 in the direction of arrows B-B illustrating the formation of the gate dielectric, gate and gate spacers.

DETAILED DESCRIPTION

A practical issue of a SiGe FinFET on a bulk silicon substrate is the generation of dislocation defects at the SiGe/silicon interface when the SiGe thickness, that is, the SiGe fin height, exceeds the so-called "critical thickness". In prior art SiGe fin formation, SiGe is epitaxially grown on a silicon substrate followed by fin patterning to form SiGe fins. For a given germanium concentration in the SiGe, defects such as dislocations are generated in the SiGe epitaxy layer when its thickness exceeds the so-called "critical thickness". When the SiGe thickness is below the "critical thickness", there is no defect in SiGe epitaxy layer. Since SiGe fins are formed after SiGe epitaxy, any defects in SiGe epitaxy layer will becomes part of SiGe fin. SiGe fin height is determined by the original thickness of the epitaxy SiGe layer. The critical thickness may be defined as the maximum thickness of an epitaxy film that is thermodynamically stable without generating dislocation defects. The critical thickness depends on the lattice mismatch between the epitaxy film and the substrate. For SiGe with 25 atomic % germanium epitaxially grown on a silicon substrate, the critical thickness is about 10 nm.

Figure 1:
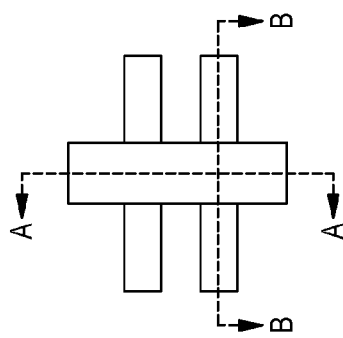
FIG. 1 is a plan view of a prior art bulk SiGe FinFET.
Figure 2B:
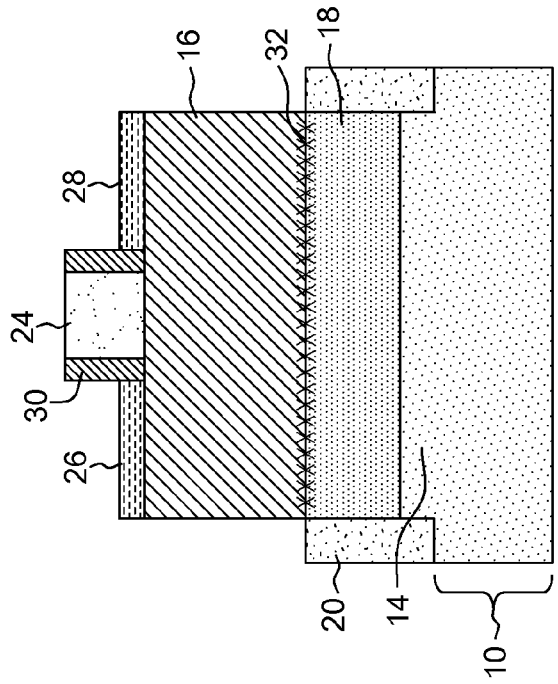
FIG. 2A is a cross-sectional view of FIG. 1 in the direction of arrows A-A and FIG. 2B is a cross-sectional view of FIG. 1 in the direction of arrows B-B.
Figure 2A:
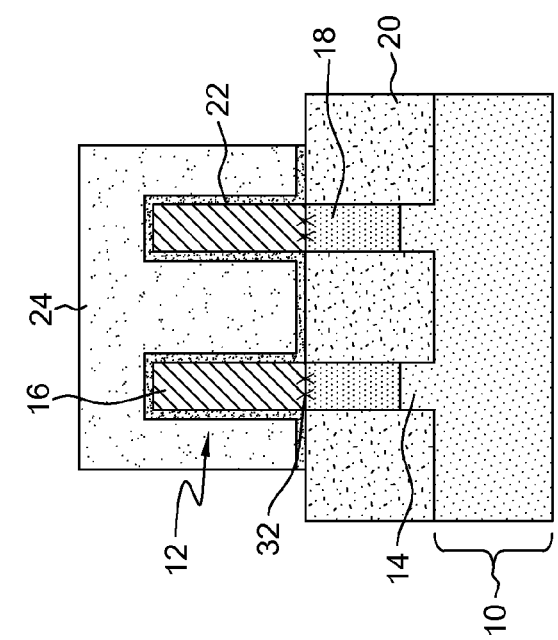

Referring back to FIGS. 2A and 2B, there are shown the dislocations 32 that may occur at the SiGe/silicon interface. The SiGe fins 16 extend from and above the silicon trench isolation 20.

There are at least two problems that may occur with dislocations. One problem is that when dislocations are present at the p-n junction between source and drain to well, the dislocations may cause excessive junction leakage. Another problem is that when dislocations are present in the channel region underneath the SiGe fin 16 shown in FIGS.

2A and 2B, the dislocations may cause potential shorts between the source and drain due to dislocation-enhanced dopant diffusion.

Accordingly, it would be advantageous to form a SiGe FinFET on a bulk silicon substrate without the above problems when dislocations may be formed at the SiGe/silicon interface.

The exemplary embodiments provide a structure and method for forming a SiGe FinFET on a silicon bulk substrate in which the SiGe/silicon interface is pushed far away from the device region. Then, even when dislocations may be formed at the SiGe/silicon interface, the dislocations may have no impact on the SiGe FinFET device.

Figure 3:
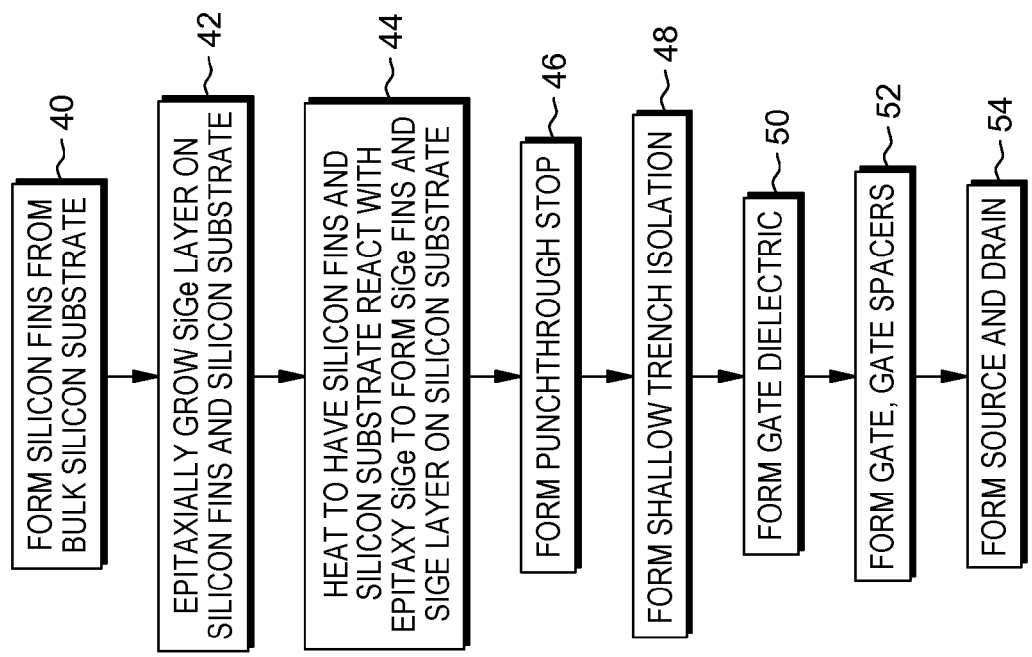
FIG. 3 is a flow chart describing the method for forming a bulk SiGe FinFET and a bulk SiGe FinFET structure according to the exemplary embodiments.

Referring now to FIG. 3 in conjunction with FIGS. 4 to 10A and 10B, there is illustrated the method for forming a bulk SiGe FinFET and a bulk SiGe FinFET structure according to the exemplary embodiments.

Figure 4:
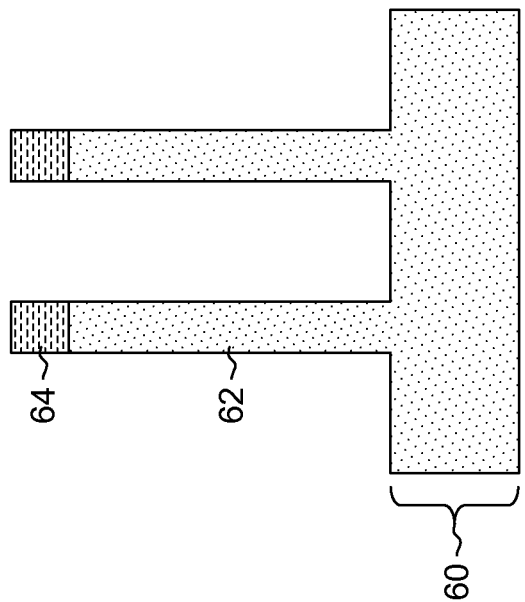

In a first step, the silicon fins are formed from the bulk silicon substrate, box 40 FIG. 3. Referring to FIG. 4, silicon fins 62 are shown extending from the bulk silicon substrate 60. The silicon fins 62 may be formed by any conventional process including but not limited to sidewall imaging transfer. On top of silicon fins 62 may be a silicon nitride hardmask 64 left over from the fin formation process.

Figure 5:
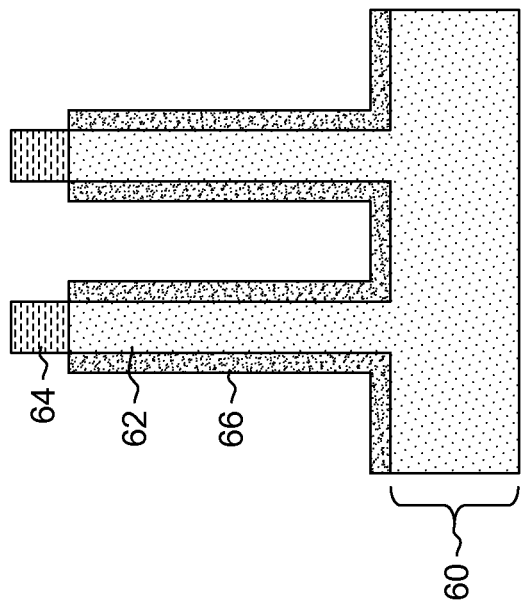

Next, a SiGe layer 66 is formed on the silicon fins 62 and bulk silicon substrate 60, box 42 FIG. 3. As shown in FIG. 5, the SiGe layer 66 is on the sides of the fins 62 and on top of the bulk silicon substrate 60. The thickness of the SiGe layer 66 is about 5 nanometers (nm). The thickness of the SiGe layer 66 should be less than the critical thickness which, as described earlier, may be about 10 nm.

The SiGe layer 66 goes through a condensation process in which the silicon in the silicon fin 62 and a surface of the bulk silicon substrate 60 is converted to SiGe, box 44. The condensation process is basically an oxidation of the SiGe. During oxidation, the oxygen is attracted to the silicon in the SiGe but not the germanium. As a result, the silicon in the SiGe and the oxygen react to form silicon oxide. The germanium in the SiGe layer, however, is repelled to the silicon fin core and the surface of the bulk silicon substrate and mixes with the silicon to form SiGe. The condensation processing conditions may include an oxygen pressure of 10 Torr to 1000 Torr and a temperature of 1000 to 1250° C. for 2 seconds to 30 minutes depending on the temperature and oxygen pressure.

As shown in FIG. 6, the silicon fin 62 after the condensation process is now SiGe fin 72. The SiGe layer 66 that was on the bulk silicon substrate 60 has now converted a top portion of the bulk silicon substrate to a SiGe gradient 70. The bulk silicon substrate 60 thus may now include a bulk silicon portion 61 and the SiGe gradient 70. The SiGe gradient 70 has a composition of SiGe at the top 74 of the SiGe gradient 70 that is the same composition of SiGe as in SiGe fin 72. The proportion of germanium atoms gradually decreases and the proportion of silicon atoms gradually increases in the SiGe gradient 70 until there is all silicon at the SiGe gradient/silicon interface 75. Further, the SiGe layer 66 that was on the fins 12 and bulk silicon substrate 60 is now silicon oxide 68.

The SiGe gradient 70 may have a thickness of about 5 to 30 nm.

Thereafter, the punchthrough stop (PTS) may be formed, box 46 FIG. 3, followed by a shallow trench isolation fill process, box 48 FIG. 3. FIG. 7 shows the PTS 76 in a bottom portion 73 of the SiGe fin 72. The PTS 76 may be formed by any suitable doping technique such as ion implantation, plasma doping, solid phase doping. If needed, a thermal anneal, such as a laser anneal, rapid thermal anneal or furnace anneal, may be used to activate the dopants in the punchthrough stop 76. Thereafter, conventional shallow trench isolation (STI) 78 may be deposited.

Since the STI 78 is typically a silicon oxide just like the silicon oxide 68 left over from the SiGe condensation, then silicon oxide 68 may form part of the STI 78. Alternatively, the silicon oxide 68 may be etched away, followed by deposition of the STI 78. A wet etch process containing hydrofluoric acid can be used to etch the silicon oxide 68.

Figure 8:
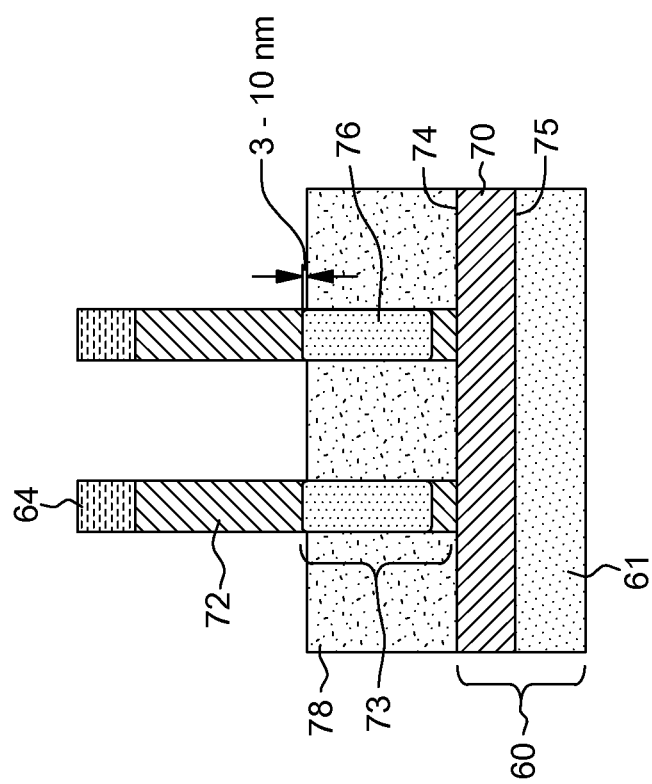

The STI 78 may be etched back to expose the bottom portion 73 of the SiGe fins 72 as shown in FIG. 8. It is preferred that the STI 78 be etched back to about 3 to 10 nm below the top of the PTS 76 so that the gate in subsequent process steps may wrap around the entire SiGe fin channel above the PTS 76 to ensure complete gate control of the SiGe fin channel.

In subsequent process steps, the gate dielectric, gate, gate spacers and source/drain are formed on the SiGe fins 72, boxes 50, 52, 54 FIG. 3.

Figure 9:
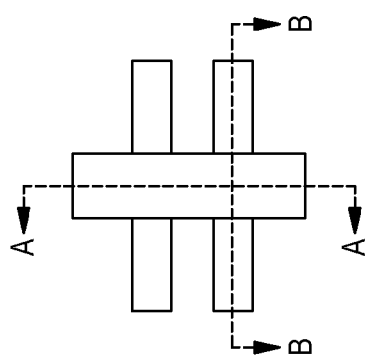
Figure 10B:
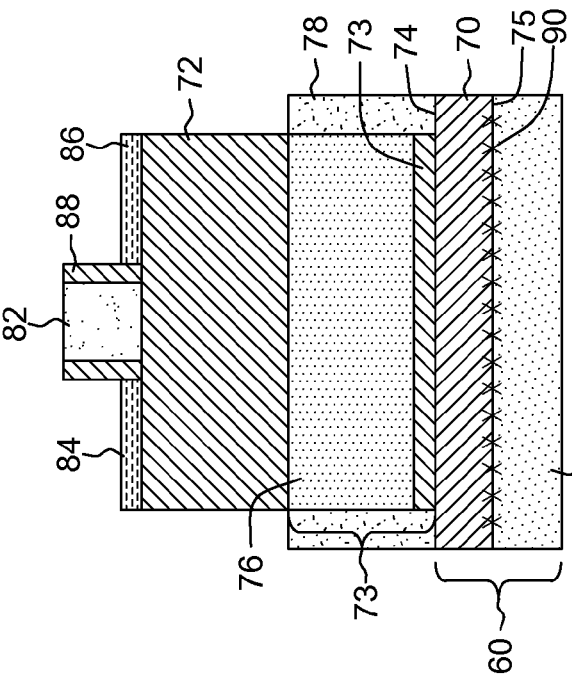
Figure 10A:
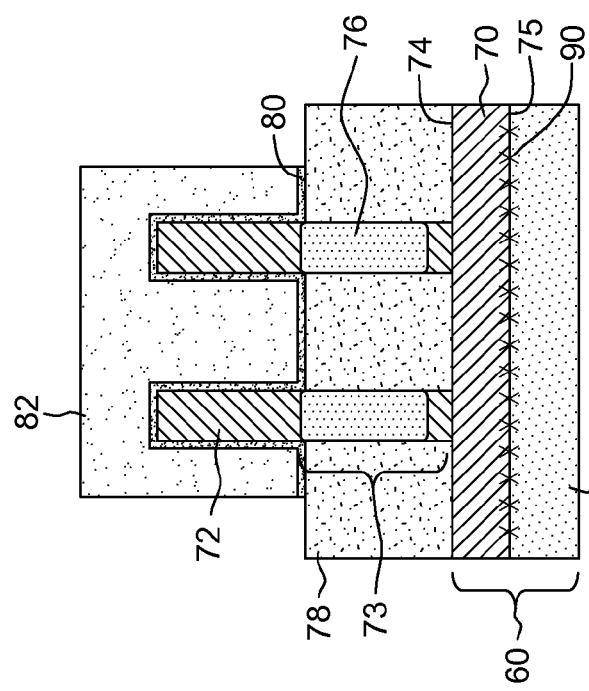

FIG. 9 illustrates a plan view of the bulk SiGe FinFET according to the exemplary embodiments. FIG. 10A is a cross-sectional view of FIG. 9 in the direction of arrows A-A and FIG. 10B is a cross-sectional view of FIG. 9 in the direction of arrows B-B.

The hard mask 64 in FIG. 8 has been removed. A gate dielectric 80 is wrapped around the center of the fins 72 followed by wrapping of a gate 82 around the gate dielectric 80. Source 84 and drain 86 have been added along with spacers 88.

Gate dielectric 80 may comprise silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

Gate 82 may comprise polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition.

Further shown in FIGS. 10A and 10B are dislocations 90 which may form at the interface 75 between the SiGe gradient 70 and the bulk silicon portion 61 of the bulk silicon substrate 60. These dislocations 90 are now far away from the device region which is proximate to the top of the STI 78.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A bulk SiGe FinFET comprising:
a plurality of SiGe fins and a bulk semiconductor substrate, the SiGe fins extending from the bulk semiconductor substrate;
the SiGe fins having a top SiGe portion and a bottom SiGe portion, a part of the bottom SiGe portion being doped to form a punchthrough stop;
the bulk semiconductor substrate having a top portion in contact with the bottom SiGe portions of the SiGe fins and comprising a gradient of germanium and silicon, and a bottom portion of silicon in contact with the top portion such that the gradient has a composition of SiGe at the top portion in contact at an interface with the SiGe fins that is the same composition of SiGe as in the SiGe fins, the proportion of germanium atoms in the gradient gradually decreasing from the interface and the proportion of silicon atoms in the gradient gradually increasing in the gradient from the interface until the bulk semiconductor substrate top portion contacts at a second interface the bulk semiconductor substrate bottom portion.

2. The bulk SiGe FinFET of claim 1 wherein the SiGe gradient in the top portion of the bulk semiconductor substrate comprises 0% germanium and 100% silicon where the top portion of the bulk semiconductor substrate contacts the bottom portion of the bulk semiconductor substrate.

3. The bulk SiGe FinFET of claim 2 wherein the bottom portion of the bulk semiconductor substrate is silicon.

4. The bulk SiGe FinFET of claim 1 further comprising shallow trench isolation between bottom portions of adjacent SiGe fins.

5. The bulk SiGe FinFET of claim 4 wherein the punchthrough stop is at a first height of the bottom portion of the SiGe measured from the bulk semiconductor top portion and the shallow trench isolation is at a second height of the bottom portion of the SiGe fins measured from the bulk semiconductor top portion such that the first height is greater than the second height.

6. The bulk SiGe FinFET of claim 5 wherein the first height is greater than the second height by 3 to 10 nm.

7. The bulk SiGe FinFET of claim 1 further comprising a gate dielectric wrapping around the top portion of the SiGe fins and a gate wrapping around the gate dielectric.

8. The bulk SiGe FinFET of claim 1 wherein the bottom SiGe portions of the SiGe fins are in direct contact with the top portion of the bulk semiconductor substrate.

9. The bulk SiGe FinFET of claim 1 wherein the top portion of the bulk semiconductor substrate is in direct contact with the bottom portion of the bulk semiconductor substrate.

10. The bulk SiGe FinFET of claim 1 wherein the SiGe gradient has a thickness of 5 to 30 nm.

11. The bulk SiGe FinFET of claim 1 further comprising dislocation defects at the second interface of the top portion of the bulk semiconductor substrate with the bottom portion of the bulk semiconductor substrate.

12. A method of forming a bulk SiGe FinFET comprising:
forming silicon fins from a bulk silicon substrate;
epitaxially growing a SiGe layer on the silicon fins and on the bulk silicon substrate;
heating the silicon fins and the bulk silicon substrate in an oxygen ambient to cause the Ge of the SiGe layer to react with the silicon in the silicon fins and a top portion of the bulk silicon substrate to form SiGe;
forming a punchthrough stop in a bottom portion of the SiGe fins;
forming shallow trench isolation in contact with the bottom portion of the SiGe fins;
forming a gate dielectric wrapping around a top portion of the SiGe fins;
forming a gate wrapping around the gate dielectric; and
forming a source and a drain.

13. The method of claim 12 wherein the SiGe in the top portion of the bulk silicon substrate forms a gradient of germanium and silicon wherein the SiGe gradient in the top portion of the bulk semiconductor substrate has a composition of SiGe at the top portion in contact with the SiGe fins that is the same composition of SiGe as in the SiGe fins, the proportion of germanium atoms in the gradient gradually decreasing and the proportion of silicon atoms in the gradient gradually increasing in the gradient until there is 0% germanium and 100% silicon where the top portion of the bulk semiconductor substrate contacts the bottom portion of the bulk semiconductor substrate.

14. The method of claim 13 wherein the bottom portion of the bulk semiconductor substrate is silicon.

15. The method of claim 13 further comprising shallow trench isolation between bottom portions of adjacent SiGe fins.

16. The method of claim 15 wherein the punchthrough stop is at a first height of the bottom portion of the SiGe fins measured from the bulk semiconductor top portion and the shallow trench isolation is at a second height of the bottom portion of the SiGe fins measured from the bulk semiconductor top portion such that the first height is greater than the second height.

17. The method of claim 16 wherein the first height is greater than the second height by 3 to 10 nm.

18. The method of claim 13 wherein the SiGe fins are in direct contact with the top portion of the bulk semiconductor substrate.

19. The method of claim 13 wherein the top portion of the bulk semiconductor substrate is in direct contact with bottom portion of the bulk semiconductor substrate.

20. The method of claim 13 wherein the SiGe gradient has a thickness of 5 to 30 nm.

* * * * *